(12) United States Patent
Verhaverbeke et al.

(10) Patent No.: US 6,491,763 B2
(45) Date of Patent: Dec. 10, 2002

(54) PROCESSES FOR TREATING ELECTRONIC COMPONENTS

(75) Inventors: Steven Verhaverbeke, San Francisco, CA (US); Lewis Liu, Paoli, PA (US); Alan Walter, Chester Springs, PA (US); C. Wade Sheen, Chester Springs, PA (US); Christopher McConnell, Berwyn, PA (US)

(73) Assignee: Mattson Technology IP, Wilmington, DE (US)

( * ) Notice: Subject to any disclaimer, the term of this patent is extended or adjusted under 35 U.S.C. 154(b) by 0 days.

(21) Appl. No.: 09/805,348

(22) Filed: Mar. 13, 2001

(65) Prior Publication Data

US 2002/0033186 A1 Mar. 21, 2002

Related U.S. Application Data

(60) Provisional application No. 60/188,895, filed on Mar. 13, 2000.

(51) Int. Cl.⁷ .............................. B08B 3/00; B08B 7/04
(52) U.S. Cl. .............................. 134/26; 134/30; 134/31; 134/2; 134/3
(58) Field of Search ..................... 134/2, 3, 26, 28, 134/29, 30, 31

(56) References Cited

U.S. PATENT DOCUMENTS

| | | | |
|---|---|---|---|
| 3,988,256 A | * 10/1976 | Vandermey et al. | 134/36 |
| 4,577,650 A | 3/1986 | McConnell | 134/59 |
| 4,633,893 A | 1/1987 | McConnell et al. | 134/95 |
| 4,738,272 A | 4/1988 | McConnell | 134/59 |
| 4,740,249 A | 4/1988 | McConnell | 134/25.4 |
| 4,778,532 A | 10/1988 | McConnell et al. | 134/10 |
| 4,795,497 A | 1/1989 | McConnell et al. | 134/18 |
| 4,856,544 A | 8/1989 | McConnell | 134/95 |
| 4,899,767 A | 2/1990 | McConnell et al. | 134/56 R |
| 4,911,761 A | 3/1990 | McConnell et al. | 134/11 |
| 4,917,123 A | 4/1990 | McConnell et al. | 134/95 |
| 4,984,597 A | 1/1991 | McConnell et al. | 134/95 |
| 5,082,518 A | 1/1992 | Molinaro | 156/345 |
| 5,181,985 A | 1/1993 | Lampert et al. | 156/662 |
| 5,383,484 A | 1/1995 | Thomas et al. | 134/184 |
| 5,464,480 A | 11/1995 | Matthews | 134/1.3 |
| 5,503,708 A | 4/1996 | Koizumi et al. | 156/643.1 |
| 5,569,330 A | 10/1996 | Schild et al. | 134/1 |
| 5,571,337 A | 11/1996 | Mohindra et al. | 134/7 |
| 5,712,198 A | 1/1998 | Shive et al. | 437/235 |
| 5,762,755 A | 6/1998 | McNeilly et al. | 156/652.1 |
| 5,810,940 A | 9/1998 | Fukazawa et al. | 134/3 |
| 5,938,857 A | 8/1999 | Fujiwara et al. | 134/2 |
| 6,132,522 A | 10/2000 | Verhaverbeke et al. | 134/26 |
| 6,165,279 A | 12/2000 | Tsao et al. | 134/3 |
| 6,245,185 B1 | 6/2001 | Verhaverbeke | 134/10 |

FOREIGN PATENT DOCUMENTS

| | | |
|---|---|---|
| EP | 0 233 184 | 4/1992 |
| KR | 9408366 | 9/1994 |

OTHER PUBLICATIONS

Burkman et al., "Wet Chemical Processes–Aqueous Cleaning Processes", Handbook of Semiconductor Wafer Cleaning Technology, Kern, W. (Ed.), Noyes Publication, Parkridge, NJ, 1993, Chapter 3, 111–151.

(List continued on next page.)

Primary Examiner—Randy Gulakowski
Assistant Examiner—S. Chaudhry
(74) Attorney, Agent, or Firm—Woodcock Washburn LLP

(57) ABSTRACT

A process for treating an electronic component wherein the electronic component is exposed to a heated solvent and subsequently exposed to an ozonated process fluid. The electronic component is optionally exposed to the heated solvent by exposing the electronic component to a passing layer of heated solvent. An apparatus for treating electronic components with a heated solvent and an ozonated process fluid is also provided.

51 Claims, 5 Drawing Sheets

OTHER PUBLICATIONS

Vossen, J.L., et al., "Chemical Etching", *Thin Film Processes*, Academic Press, NY, 1978, vol. 1, 403–447 and 452–481.

Verhaverbeke, S. et al., "Scientific Rinsing and Drying on Macro and Microscale," in *Semiconductor Pure Water and Chemicals Conference 1996*, Balazs, M.K. (ed.), Santa Clara, CA Mar. 4–7, 1996, 14 pages.

DeGendt, S., et al., "A novel resist and post–etch residue removal process using ozonated chemistries,"*Symposium on VLSI Tech. Dig. Tech. Papers*, 1999, 168–169.

Fukazawa, Y., et al., "Direct replacement cleaning technology based on ozonated water using a single processing tank," *Abstract No. 1892*, 2176–2177.

Han, J., et al., "The behavior of ozone in wet cleaning chemicals," *Abstract No. 1889*, 2172.

Joo, J.D., et al., "Comparison of cleaning efficiencies of noble metals on si surface betweenO)$_3$–UPW and SPM," *Abstract No. 1891*, 2174–2175.

Kao, D.B., et al., "Vapor–phase pre–cleans for furnace––grown and rapid–thermal thin oxides," *Proced. 2$^{nd}$ International Symposium*, Ruzyllo, J., et al. (eds.), 1992, 92(12), 251–259.

Kashkoush, I., et al., "Photoresist stripping using ozone/ de–ionized water chemistr,." *Abstract 1934*, 2236–2237.

Kenens, C., et al., "Removal of organic contamination from silicon surfaces," *Proceed. of the 3$^{rd}$ International Symposium*, 1996, 107–110.

Li, L., et al., "UV/ozone pre–treatment on organic contaminated wafer for complete oxide removal in HF vapor cleaning,"*Proceedings of 2$^{nd}$ International Symposium*, 1994, 163–166.

Li, L., et al., "Optimization of ozonized DI rinse for HF last pre–gate clean," *Abstract No. 1890*, 2173.

Ohmi, T., et al., "Native oxide growth and organic impurity removal on Si surface with ozone–injected ultrapure water," *Electrochem. Soc.*, 1993, 140(3), 805–810.

Olness, G., et al., "Investigation of the gas–phase effluents and surface residuals of ozone ashed photoresists," *Mat. Res. Soc. Symp. Proc.*, 1993, 315, 261–266.

Wolke, K., et al., "Efficiency of ozone dissolution into ambient temperature rinse baths," *Abstract No. 1887, Electrchem. Soc., Inc. and Internat. Soc Of Electrochem.*, 1997, 2170.

Yonekawa, N., et al., "Contamination removal by wafer spin cleaning process with advanced chemical distribution system," Bowling, A., et al. (eds.), *Proceedings of the 3$^{rd}$ Internat. Sympo.*, 94(7), 94–101.

Gise, P. et al., "Semiconductor and Integrated Circuit Fabrication Techniques", Reston Publishing Co., Reston, VA, 1979.

Matthews, et al., "Photoresist stripping using ozone/deionized water chemistry," *Mat. Res. Soc. Symp. Proc.*, 1997, 477, 173–178.

Kenens, C., et al., "Efficiency of ozonated D1 water in removing organic contamination," *Joint Int'l Mtg. of Electro. Chem. Soc'y and Intn't Soc'y of Electro.*, 1997, Abstract 1886, 2169.

Osaka, et al., *Joint Int'l Mtg. of Electro. Chem. Soc'y and Intn't Soc'y of Electro.*, 1997, Abstract 1888, 2171.

Moon, "Surface analysis group Korea research institute of stndards and science,"2$^{nd}$ Workshop on Semiconductor Wafer Cleaning and Surface Characterization, *Research Institute of Industrial Science & Technology*, 68–76.

U.S. patent application Ser. No. 09/253,157, Bay et al., filed Feb. 19, 1999.

U.S. patent application Ser. No. 60/111,350, Verhaverbeke et al., filed Dec. 08, 1998.

U.S. patent application Ser. No. 09/209,101, Verhaverbeke et al., filed Dec. 10, 1998.

* cited by examiner

PROCESSES FOR TREATING ELECTRONIC COMPONENTS

This application claims benefit of U.S. provisional Application Ser. No. 60/188,895 filed Mar. 13, 2000.

FIELD OF THE INVENTION

The present invention relates to processes and apparatus for treating electronic components and, in particular, to processes and apparatus for treating semiconductor wafers with a combination of a heated solvent and an ozonated process fluid to remove or strip bulk photoresist.

BACKGROUND OF THE INVENTION

Wet processing of electronic components, such as semiconductor wafers, flat panels, and other electronic component precursors is used extensively during the manufacture of integrated circuits. Semiconductor fabrication is described generally, for example, in P. Gise et al., Semiconductor and Integrated Circuit Fabrication Techniques (Reston Publishing Co. Reston, Va. 1979), the disclosure of which is herein incorporated by reference in its entirety.

Preferably, wet processing is carried out to prepare the electronic components for processing steps such as diffusion, ion implantation, epitaxial growth, chemical vapor deposition, hemispherical silicon grain growth, or combinations thereof. During wet processing, the electronic components are contacted with a series of processing solutions. The processing solutions may be used, for example, to etch, remove photoresist, clean, grow an oxide layer, or rinse the electronic components. See, e.g., U.S. Pat. Nos. 4,577,650; 4,740,249; 4,738,272; 4,856,544; 4,633,893; 4,778,532; 4,917,123; and EP 0 233 184, assigned to a common assignee, and Burkman et al., *Wet Chemical Processes-Aqueous Cleaning Processes*, pg. 111–151 in *Handbook of Semiconductor Wafer Cleaning Technology* (edited by Werner Kern, Published by Noyes Publication Parkridge, New Jersey 1993), the disclosures of which are herein incorporated by reference in their entirety.

There are various types of systems available for wet processing. For example, the electronic components may be processed in a single vessel system closed to the environment (such as an Omni system employing Full-Flow™ technology supplied by Mattson Technology, Inc.), a single vessel system open to the environment, or a muliple open bath system (e.g., wet bench) having a plurality of baths open to the atmosphere.

Following processing, the electronic components are typically dried. Drying of the semiconductor substrates can be done using various methods, with the goal being to ensure that there is no contamination created during the drying process. Methods of drying include evaporation, centrifugal force in a spin-rinser-dryer, steam or chemical drying of wafers, including the methods and apparatus disclosed in, for example, U.S. Pat. No. 4,911,761.

An important consideration for an effective wet processing method is that the electronic component produced by the process be ultraclean (i.e., with minimum particle contamination and minimum chemical residue). An ultraclean electronic component is preferably free of particles, metallic contaminants, organic contaminants, and native oxides; has a smooth surface; and has a hydrogen-terminated surface. Although wet processing methods have been developed to provide relatively clean electronic components, there is always a need for improvement because of the intricacies associated with technological advances in the semiconductor industry. One of the most challenging problems of attaining ultraclean products is the removal of photoresist.

The use of ozone for removing organic material, such as photoresist, from semiconductor wafers has been investigated. For example, U.S. Pat. No. 5,464,480 issued to Matthews (hereinafter "Matthews"), describes a process in which semiconductor wafers are contacted with a solution of ozone and water at a temperature of about 1° C. to about 15° C. Matthews discloses, for example, placing the semiconductor wafers into a tank containing deionized water, diffusing ozone into the deionized water for a time sufficient to oxidize the organic materials from the wafers, while maintaining the temperature of the water at between about 1° C. to about 15° C., and then rinsing the wafers with deionized (DI) water. Matthews further discloses exposing the wafers to ultraviolet light during the process.

Various other methods have been investigated using ozone in conjunction with water to strip organic materials from the surface of semiconductor wafers or to rinse wafers after chemical processing. For example, in one such method, ozone gas is generated in an ozone generator and fed to an ozonator where the ozone gas is mixed with DI water. The ozone gas is also simultaneously fed to the bottom of the process vessel via a specially designed device that provides a uniform stream of gaseous ozone into the bath. Matthews et al., *Mat. Res. Soc. Symp. Proc.*, 1997, 477, 173–78. See also 1997 *Joint Int'l Mtg. of Electro. Chem. Soc'y and Int'l Soc'y. of Electro., Abstract* 1886, p. 2169 submitted by Kenens et al.; Id. at Abstract 1887, p. 2170, submitted by Wolke et al.; Id. at Abstract 1892, p. 2176, submitted by Fukazawa et al.; Id. at Abstract 1934, p. 2236, submitted by Kashkoush et al.; Id. at Abstract 1890, p. 2173, submitted by Li et al.; Id. at Abstract 1891, p. 2174, submitted by Joo et al.; Ultra Clean Processing of Silicon Surfaces UCPSS 1996, Kenens et al., *Removal of Organic Contamination From Silicon Surfaces*, p. 107–110.

In another method, the use of ozone-injected ultrapure water (ozone concentration of about 1–2 ppm) is applied to the RCA or other similar cleaning methods. The ozonated water is used to remove organic impurities. The wafers are then treated with $NH_4OH$ and $H_2O_2$ to remove metallic ion contaminants, followed by a treatment with HF and $H_2O_2$ to remove native oxide and metal, and to improve surface smoothness. The wafers are then rinsed with DI water. The ozone gas is generated by electrolyzing ultra pure water. The generated ozone gas is then dissolved in ultrapure water through a membrane. Ohmi et al., *J. Electrochem. Soc'y* 140, 1993, 804–10.

Another method uses a moist ozone gas phase. In this method, a quartz container is filled with a small amount of liquid, sufficient to immerse an $O_3$ diffuser. The liquid is DI water spiked with additives such as hydrogen peroxide or acetic acid, if appropriate. A lid is placed on the container and the liquid is heated to 80° C. Wafers are placed directly above the liquid interface (i.e., the wafers are not immersed in the liquid). Heating of the liquid in a sealed container and continuous $O_3$ bubbling through the liquid exposes the wafers to a moist ambient $O_3$ environment. De Gendt et al., *Symp. VLSI Tech. Dig. Tech. Papers*, 1998, 168–69. The De Gendt paper further describes a method whereby a quartz tank is filled with 7 liters of liquid, an ozone diffuser is located at the bottom of the tank, and the liquid is heated. The wafers are positioned directly above the ozone diffuser and immersed in the liquid such that $O_2/O_3$ bubbles contact the wafer surfaces. The De Gendt paper also reports that OH radical scavengers such as acetic acid can enhance process efficiency.

In another method, photoresist removal is carried out in a gas phase reactor at a temperature of between about 200–300° C. In certain instances, additives such as $N_2O$ gas are mixed with the ozone gas. See Olness et al., Mat. Res. Soc'y. Symp., 135, 1993, 261–66.

Spin cleaning techniques using ozonated water have also been investigated. See, e.g., Cleaning Technology In Semiconductor Device Manufacturing Symposium, Yonekawa et al., *Contamination Removal By Wafer Spin Cleaning Process With Advanced Chemical Distribution System*, 94–7, 94–101; 1997 *Joint Int's Mtg. of Electro. Chem. Soc'y and Int'l Soc'y. of Elctro., Abstract* 1888, p. 2171 submitted by Osaka et al.

The use of ozone with cleaning solutions has also been investigated. One such method uses a wafer cleaning sequence with a single-wafer spin using ozonated water and dilute HF to remove contaminants such as particles, metallics, and organics from the wafer surfaces. The method consists of pouring ozonated water on a wafer surface for 10 seconds, followed by pouring dilute HF over the wafers for 15 seconds. This cycle is repeated until the desired results are achieved. 1997 *Joint Int's Mtg. of Electro. Chem. Soc'y and Int'l Soc'y. of Elctro., Abstract* 1888, p. 2171 submitted by Tsutomu et al.; see also Id. at Abstract 1889, p. 2172, submitted by Han et al.; Id. at Abstract 1892, p. 2176, submitted by Fukazawa et al.; Ultra Clean Processing of Silicon Surfaces UCPSS 1996, Kenens et al., *Removal of Organic Contamination From Silicon Surfaces*, p. 107–10.

Cleaning of semiconductor wafers has also been carried out using gaseous ozone and other chemicals such as hydrofluoric acid and hydrochloric acid to remove residual contaminating particles. For example, U.S. Pat. No. 5,181,985 to Lampert et. al., (hereafter, "Lampert") discloses a cleaning process where water is sprayed at a temperature of 10□ C. to 90°□ C. onto semiconductor wafers and a chemically active gaseous substance such as ammonia, hydrogen chloride, ozone, ozonized oxygen, chlorine, or bromine is introduced. In Lampert, ozone or ozonized oxygen is used to form a superficial oxide which is then subsequently removed with hydrofluoric acid or hydrochloric acid.

Ozone has also been used in conjunction with sulfuric acid as a means for stripping photoresist from semiconductor wafers. See, e.g., U.S. Pat. Nos. 4,899,767 and 4,917,123 issued to CFM Technologies. The methods described in the CFM patents are carried out in a single vessel system and, generally, a solution of sulfuric acid is spiked with an oxidizing agent such as ozone. Other systems using sulfuric acid in conjunction with ozone may employ a gas distribution system that includes a sparger plate with holes for distributing gas through a bath in the tank. See, e.g., U.S. Pat. No. 5,082,518 assigned to SubMicron. SubMicron's patent describes the use of an apparatus that distributes ozone directly into the treatment tank containing the sulfuric acid.

Ozone ashing has also been investigated as a means for removing photoresist material from wafers. In this method, photoresist is oxidized at higher temperatures (250–350° C.) by two strong oxidizing gases, ozone and atomic oxygen. A small amount of excited nitrous oxide enhances the ashing rate. See Olness et al., Mat. Res. Soc'y. Symp., 135, 1993, 261–66.

U.S. Pat. No. 5,503,708 to Koizumi et al., ("Koizumi") discloses an alternative apparatus and method using gaseous ozone for removing a photoresist film from a semiconductor wafer. In Koizumi, an apparatus is used that processes a single wafer at a time. The apparatus exposes the wafer to a gas mixture containing ozone and alcohol while the wafer surface is preferably heated to a temperature of 150° C. to 250° C. to effect removal of the photoresist.

The use of ozone in precleaning steps has also been explored. In one such method, as disclosed in U.S. Pat. No. 5,762,755 to McNeilly et al., a wafer contaminated with organics is held in a partial vacuum and heated to at least 200° C. by radiation and then exposed to ozone. The wafer is then cooled to, or below, 80° C. and then exposed to ultraviolet excited chlorine.

Another method for pre-cleaning wafers uses an $O_3$/IR process as an in situ cleaning step for organic removal before oxide etching to condition the surface and to assure etch repeatability and uniformity. As a posttreatment step, a thin layer of oxide may be grown on the wafer surface. In this process, the ozone is fed into the process chamber while the wafer is being heated by an infrared lamp to a certain temperature, after which the ozone is turned off and the wafer is cooled down by a low temperature inert gas. Cleaning Technology In Semiconductor Device Manufacturing Symposium, Kao et al., *Vapor-Phase pre-Cleans for Furnace-Grown and Rapid-Thermal Thin Oxides*, 1992, 251–59.

The use of ozone gas in conjunction with ultraviolet light for cleaning and etching wafer surfaces has also been investigated. See Semiconductor Wafer Cleaning and Surface Characterization (proceedings of the $2^{nd}$ workshop), Moon, *Si Wafer Cleaning Study by UV/Ozone ands In Situ Surface Analysis*, 68–76; ASM Int'l, Li et al., *UV/Ozone Pre-Treatment on Organic Contaminated Wafer for Complete Oxide Removal in HF Vapor Cleaning*.

It is known to remove photoresist from electronic components using ashing processes. However, complete removal of the photoresist with ashing is difficult to achieve because the ashing process itself can harm the electronic components surface. For example, ashing with $CF_4$ on bare silicon surfaces induces pits and, accordingly, a full ash down should typically be avoided. Further, low temperature ashing is often necessary to avoid resist popping. Consequently, the use of ashing processes typically requires one or more post-ashing processing steps (e.g., clearing and/or cleaning the component with processing solutions such as a SOM or HPM solution) to completely remove the photoresist.

There have been several attempts over the last years to use ozone ($O_3$) for bulk photoresist stripping. However, the use of ozonated process fluids (e.g., ozonated deionized water) has traditionally suffered from unsatisfactorily low etch rates.

Other process solutions ("designer" solvents and/or isopropyl alcohol) have been employed for the removal of photoresist. However, the use of such process solutions can be prohibitively expensive, may require long bath lifetimes, and may involve serious environmental risk (i.e., pollution and safety).

SUMMARY OF THE INVENTION

The present invention provides commercially viable (i.e., cost efficient and rapid) apparatus and processes for treating electronic components, such as semiconductor wafers. In one of its aspects, the present invention relates to a process for treating an electronic component wherein the electronic is first exposed to a heated solvent and subsequently exposed to an ozonated process fluid. In one embodiment, the heated solvent comprises boiling isopropyl alcohol (IPA) and the ozonated process fluid comprises ozonated deionized water. The heated solvent is preferably formed as a heated solvent layer prior to exposing the heated solvent to the electronic component.

In another of its aspects, the present invention relates to an apparatus for treating an electronic component having a chamber for holding the electronic component. The chamber preferably comprises a closed, direct displacement chamber system. The apparatus also includes a heated solvent source for supplying a heated solvent to the chamber and an ozonated process fluid source for supplying an ozonated process fluid to the chamber. In one embodiment, the heated solvent source supplies a layer of heated solvent to the chamber.

Additional features and embodiments of the present invention will become apparent to those skilled in the art in view of the ensuing disclosure and appended claims.

BRIEF DESCRIPTION OF THE DRAWINGS

The numerous objects and advantages of the present invention may be better understood by those skilled in the art by reference to the accompanying detailed description and the following drawings, in which.

DETAILED DESCRIPTION OF THE INVENTION

Figure 1:
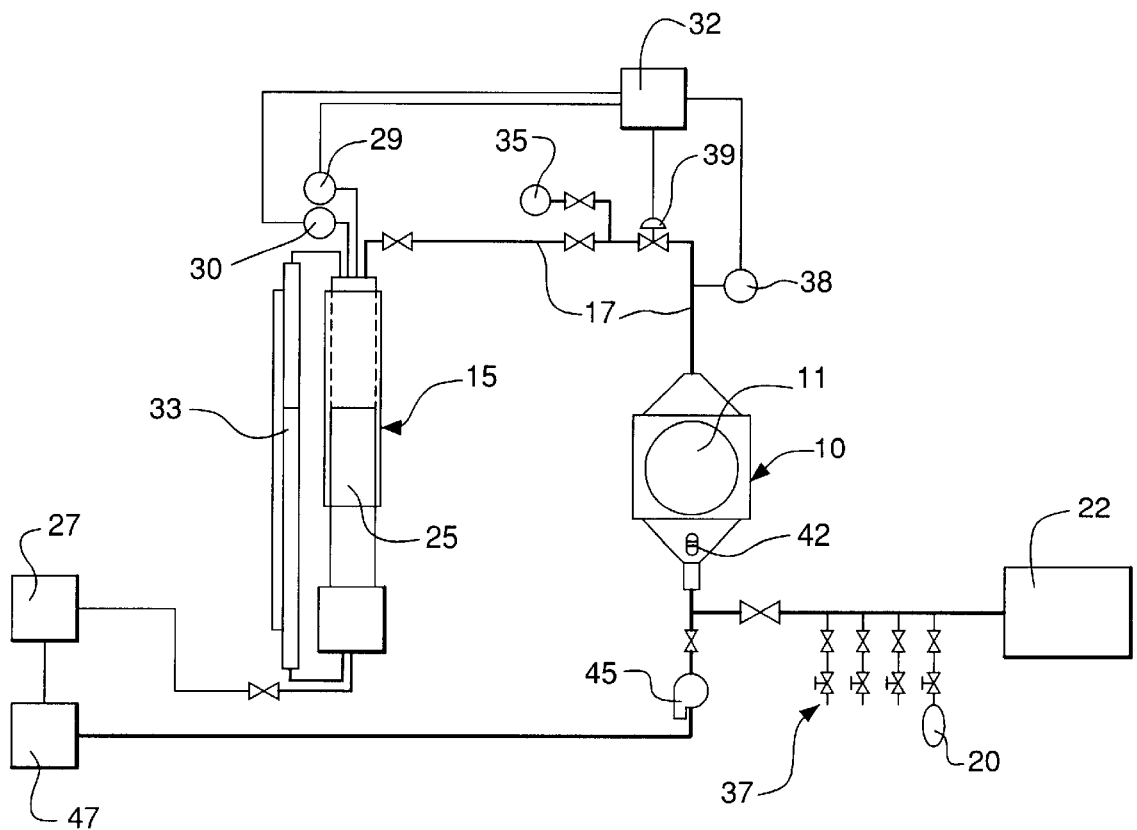
FIG. 1 is a schematic view of a system for processing electronic components in accordance with the present invention using a passing layer of heated solvent.

The present invention provides apparatus and methods for wet processing electronic components using a heated solvent and an ozonated process fluid. The apparatus and methods of the present invention are particularly useful for removing organic materials from the surfaces of electronic components. For example, during wet processing, the apparatus and methods of the present invention can be used to remove organic materials such as photoresists (ashed or unashed), plasticizers, surfactants, fluorocarbon polymers, organics from human contact, or combinations thereof. The apparatus and methods of the invention may also be used to grow an oxide layer on the electronic component surface. The apparatus and methods of the invention are also contemplated to be used for pre-treatment cleaning, etching, cleaning between processing steps, as well as post-treatment cleaning and processing (e.g., oxide growth). Although the apparatus and processes of the present invention are suitable for removing a variety of photoresists, the present invention is particularly useful for removing bulk photoresist or boron (B) implanted photoresist.

The terminology "electronic components," as used herein, includes for example electronic component precursors such as semiconductor wafers, flat panels, and other components used in the manufacture of electronic components (i.e., integrated circuits); CD ROM disks; hard drive memory disks; or multichip modules.

The terminology "wet processing" or "wet process" as used herein means the electronic components are contacted with one or more liquids (hereinafter referred to as "process liquids" or "process solutions") to process the electronic components in a desired manner. For example, it may be desired to treat the electronic components to clean, etch, or remove photoresist from the surfaces of the electronic components. It may also be desired to rinse the electronic components between such treatment steps.

Wet processing may also include steps where the electronic components are contacted with other fluids, such as a gas, a vapor, a liquid mixed with a vapor or gas, or combinations thereof. As used herein, the term "process fluid" includes liquids, gases, liquids in their vapor phases, or combinations thereof. The terminology "vapor" as used herein is meant to include partially vaporized liquid, saturated vapor, unsaturated vapor, supersaturated vapor or combinations thereof.

There are various process fluids used during wet processing. Generally, the most common types of process fluids used during wet processing are reactive chemical process fluids or liquids, and rinsing fluids or liquids. The terminology "reactive chemical process fluid" or "reactive chemical process liquid" as used herein, is any liquid or fluid that reacts in some desired manner with the surfaces of the electronic components to alter the surface composition of the electronic component. For example, the reactive chemical process liquid or fluid may have activity in removing contamination adhered or chemically bound to the surfaces of the electronic components, such as particulate, metallic, photoresist, or organic materials; activity in etching the surfaces of the electronic component; or activity in growing an oxide layer on the surface of the electronic component. As used herein, "rinsing liquid" or "rinsing fluid" refers to DI water or some other liquid or fluid that removes from the electronic components and/or processing chamber residual reactive chemical process fluids, reaction by-products, and/or particles or other contaminants freed or loosened by the chemical treatment step. The rinsing liquids or fluids may also be used to prevent redeposition of loosened particles or contaminants onto the electronic components or processing chamber. Examples of reactive chemical process fluids and rinsing fluids useful in the methods of the present invention are described in more detail hereinafter.

There are various ways in which the electronic components can be wet processed in accordance with the present invention. For example, wet processing can be carried out using sonic energy (such as in the megasonic energy range) during the contacting of the electronic components with the ozonated process fluid to enhance cleaning. Such methods may also include wet processing techniques disclosed in for example U.S. Pat. Nos. 5,383,484; 6,132,522; and 6,245,258; U.S. patent application Ser. No. 09/209,101, filed Dec. 10, 1998; and Ser. No. 09/253,157, filed Feb. 19, 1999; and U.S. Provisional Patent Application Ser. No. 60/111,350 filed Dec. 8, 1998, the disclosures of which are all hereby incorporated by reference in their entireties.

As used herein, "chemical treatment step" or "wet processing step" refers to contacting the electronic components with a reactive chemical process fluid or rinsing fluid, respectively.

An apparatus for processing electronic components in accordance with the present invention is depicted schematically in FIG. 1. The apparatus comprises a process chamber 10 for holding electronic components 11. A heated solvent source 15 is operatively connected to the process chamber 10 by tubing 17 for introducing heated solvent into the process chamber 10. An ozone source 20 and a deionized water (DI) supply 22 are operatively connected to the process chamber 10 for supplying an ozonated process fluid to the process chamber 10.

In the embodiment of FIG. 1, the heated solvent source 15 comprises a vaporizer 25 for receiving solvent from a solvent supply 27 and heating the solvent to form a heated solvent vapor. A pressure transmitter 29 and/or temperature transmitter 30 are preferably provided on the vaporizer 25 for monitoring the pressure and/or temperature of the heated solvent vapor. The pressure and temperature transmitters, 29 and 30, are optionally connected to a processor 32 to form a feedback loop such that the temperature of the heated solvent vapor can be automatically adjusted. A level probe 33 is optionally associated with the vaporizer 25 for monitoring the level of solvent in the vaporizer 25. In one particular embodiment, the level probe 33 is a full-length analog level probe capable of automatically monitoring refill set points associated with the vaporizer.

The vaporizer 25 is connected to the process chamber 10 via tubing 17. The tubing 17 is preferably heated to maintain the solvent in its vapor state between the vaporizer 25 and the process chamber 10. A gas source 35 is also connected to the tubing 17 to displace fluid from the process chamber 10. In other embodiments, the gas source 35 can be used to facilitate delivery of the heated solvent vapor to the process chamber 10 and/or for maintaining a pressure within the process chamber 10. In a preferred embodiment, the gas source 35 is a source of nitrogen gas.

Examples of solvents which may be employed in the heated solvent are alcohols such as methanol, ethanol, 1-propanol, isopropanol, n-butanol, secbutanol, tertbutanol, or tert-amyl alcohol, acetone, acetonitrile, hexafluoroacetone, nitromethane, acetic acid, propionic acid, ethylene glycol mono-methyl ether, difluoroethane, ethyl acetate, isopropyl acetate, 1,1,2-trichloro-1,2,2-trifluoroethane, 1,2-dichloroethane, trichloroethane, perfluoro-2-butyl tetrahydrofuran, perfluoro-1,4-dimethylcyclohexane or combinations thereof. Preferably, the process chemical is a $C_1$ to $C_6$ alcohol, such as for example methanol, ethanol, 1-propanol, isopropanol, n-butanol, secbutanol, tertbutanol, tert-amyl alcohol, pentanol, hexanol or combinations thereof. In one preferred embodiment, isopropyl alcohol (IPA) heated to a temperature of about 82° C. is used. Heated IPA has a photoresist etch rate of about 15000 Å/min.

The ozone source 20 and DI supply 22 comprise any of a variety of structures for delivering an ozonated process fluid to the process chamber 10. Although the ozone source 20 and DI supply 22 should provide an ozonated process fluid wherein the concentration of ozone is as high as possible, ozone sources and DI supplies capable of providing ozone concentrations, expressed as weight of ozone per volume of ozonated process fluid, from about 10 $g/m^3$ to about 300 $g/m^3$, from about 50 $g/m^3$ to about 250 $g/m^3$, and from about 100 $g/m^3$ to about 200 $g/m^3$ at standard temperature and pressure (25° C., 1 atm) can be utilized. Although the temperature of the ozonated process fluid that is contacted with the electronic components will depend upon the ozonated process fluid chosen, in general, the temperature of the ozonated process fluid preferably ranges from about 20° C. to about 145° C. and more preferably from about 40° C. to about 120° C. The pressure of the ozonated process fluid during contact with the electronic components is preferably from about 0 psig to about 20 psig, more preferably from about 1 psig to about 10 psig, and most preferably from about 1 psig to about 5 psig.

Other process fluids may be present in the ozonated process fluid. Examples of other process fluids include for example water, sulfuric acid, hydrochloric acid, hydrogen peroxide, ammonia hydroxide, hydrofluoric acid (buffered or unbuffered), ammonia fluoride, phosphoric acid, nitric acid, aqua regia, or combinations thereof. As acetic acid is a hydroxyl radical scavenger, preferably, the reaction chamber is substantially free of acetic acid when gaseous ozone is present in the reaction chamber to prevent the scavenging of hydroxyl radicals. The other process fluids may be present in the ozonated process fluid to preferably provide a molar ratio of ozone to the other process fluids in the ozonated process fluid in an amount of from about 1:90 to about 40:1.

The terminology "process chamber" and "reaction chamber" as used herein, refer to vessels (enclosed or open to the atmosphere), baths, wet benches and other reservoirs suitable for wet processing electronic components. The terminology "single vessel" refers to any wet processing system in which the electronic components are maintained in one processing chamber during the entire wet processing sequence.

The present invention may be carried out using a process chamber 10 comprising generally any of the known wet processing systems including, for example, multiple bath systems (e.g., wet bench) and single processing chamber systems (open or closable to the environment). See, e.g., Chapter 1: Overview and Evolution of Semiconductor Wafer Contamination and Cleaning Technology by Werner Kern and Chapter 3: Aqueous Cleaning Processes by Don C. Burkman, Donald Deal, Donald C. Grant, and Charlie A. Peterson in Handbook of Semiconductor Wafer Cleaning Technology (edited by Werner Kern, Published by Noyes Publication Parkridge, New Jersey 1993), and Wet Etch Cleaning by Hiroyuki Horiki and Takao Nakazawa in Ultra-clean Technology Handbook, Volume 1, (edited by Tadahiro Ohmi published by Marcel Dekker), the disclosures of which are herein incorporated by reference in their entirety. However, the use of a closable bath is preferred, especially for applications where bubbles in the ozonated process fluid are to be avoided (i.e, for the processing of hydrophobic wafers or wafers containing hydrophobic regions).

In one embodiment of the invention, the electronic components 11 are housed in a single processing chamber system. Preferably, single processing chamber systems such as those disclosed in U.S. Pat. Nos. 4,778,532, 4,917,123, 4,911,761, 4,795,497, 4,899,767, 4,984,597, 4,633,893, 4,917,123, 4,738,272, 4,577,650, 5,571,337 and 5,569,330, the disclosures of which are herein incorporated by reference in their entirety, are used. Preferred commercially available single processing chamber systems are Omni and Hybrid vessels such as those manufactured by Mattson Technology, Inc., and FL820L manufactured by Dainippon Screen. Such systems are preferred because foreign gas and contamination levels can be more readily controlled.

The single vessel wet processing system also preferably includes metering devices such as a control valve and/or pump for transporting chemical reagents from a storage tank area 37 to the reaction chamber 10. A processing control system, such as a personal computer, is also typically used as a means to monitor processing conditions (e.g., flow rates, mix rates, exposure times, and temperature). For example, the processing control system can be used to program the flow rates of chemical reagents and deionized water so that the appropriate concentration of chemical reagent(s) will be present in the reactive chemical process fluid.

In a most preferred embodiment of the present invention, the electronic components 11 are wet processed in an enclosable single wet processing chamber system. The processing chamber 10 can preferably be pressurized so that the ozonated process fluid can be maintained at a pressure above atmospheric pressure (for example, about 2 psig). Maintaining the ozonated process fluid under pressure within the processing chamber 10 may be desired to prevent ozone bubbles from forming within the ozonated process fluid. Bubbles should especially be avoided when the electronic components 11 being processed are hydrophobic or contain hydrophobic regions. Additionally, an elevated pressure within the processing chamber 10 of the wet processing system may be useful for maintaining a high ozone diffusion rate within the processing chamber 10, thereby improving processing efficiency.

The enclosable single wet processing chamber system is also preferably capable of receiving different process fluids in various sequences. A preferred method of delivering process fluids to the processing chamber is by direct displacement of one fluid with another. The Omni wet processing system employing Full Flow™ technology manufactured by Mattson Technology, Inc. is an example of a system capable of delivering fluids by direct displacement. Such systems are preferred because they result in a more uniform treatment of the electronic components. Additionally, often the chemicals utilized in the chemical treatment of electronic components are quite dangerous in that they may be strong acids, alkalis, or volatile solvents. Enclosable single processing chambers minimize the hazards associated with such process fluids by avoiding atmospheric contamination and personnel exposure to the chemicals, and by making handling of the chemicals safer.

A pressure transmitter 38 is optionally operatively associated with the process chamber 10 for monitoring the pressure within the process chamber 10. The pressure transmitter 38 is also optionally connected to the processor 32 for automatically controlling processing of the electronic components 11. The apparatus also optionally comprises a regulator 39 associated with the process chamber 10 for controlling the partial pressures of the carrier gas and the heated solvent vapor within the process chamber 10. In one embodiment, the regulator 39 comprises a dome-loaded regulator. The regulator 39 is also optionally associated with the processor 32 for automatically controlling processing of the electronic components. A level probe 42 is preferably provided on the process chamber 10 for monitoring the level of liquid within the process chamber 10. In one embodiment, the level probe 42 comprises a capacitance level probe. A pump 45 is provided for draining fluid from the process chamber 10. As described below, the pump 45 is operated to maintain a desired flow rate from the process chamber 10 thereby enabling a heated solvent layer to pass the electronic components 11 at a controlled rate. A recirculator 47 is optionally provided for receiving fluid containing the solvent from the process chamber 10 and recirculating the solvent to the solvent supply 27.

Preferably the wet processing system will include storage tanks for chemical reagents, such as ammonium hydroxide ($NH_4OH$) or hydrofluoric acid (HF); and a system for delivering deionized water used for rinsing the electronic components and diluting the chemical reagents. The chemical reagents are preferably stored in their concentrated form, which is: hydrogen peroxide ($H_2O_2$) (31%), $NH_4OH$ (28%), hydrochloric acid (HCl) (37%), HF (49%), and sulfuric acid ($H_2SO_4$) (98%) (percentages represent weight percentages in aqueous solutions). The storage tanks are preferably arranged in fluid communication with the reaction chamber 10 where the electronic components 11 are treated.

Figure 2:
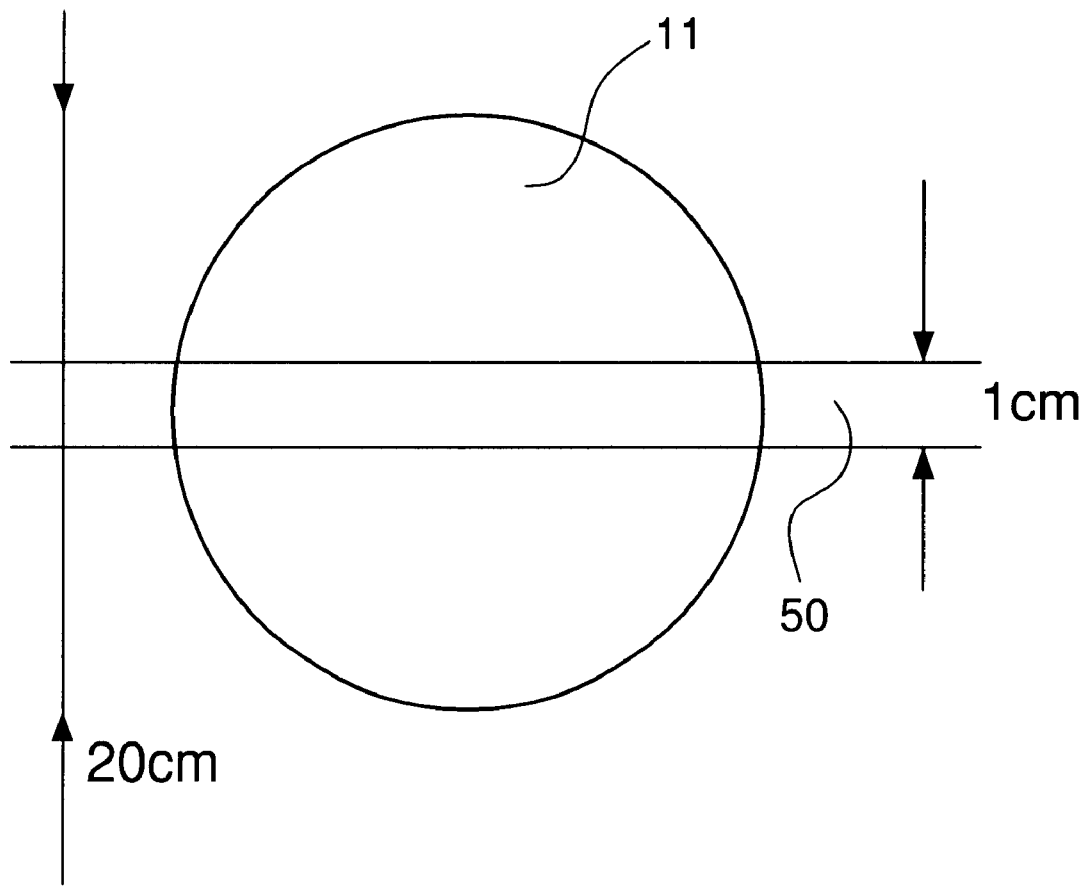
FIG. 2 is a schematic view of a semiconductor wafer (having a diameter of 20 cm) showing the use of a passing 1 cm thick layer of heated solvent.

In operation, the apparatus is used to process electronic components 11 which are placed within the processing chamber 10 by first exposing the electronic components 11 to the heated solvent and then exposing the components 11 to the ozonated processing fluid. One or more electronic components 11 are placed within the process chamber 10 and the electronic components 11 are pre-treated with one or more optional chemical process fluids. After pre-treatment, a rinsing fluid (e.g., deionized water) is preferably introduced into the process chamber 10 so that the level of rinsing fluid in the processing chamber 10 is sufficient to completely cover the electronic components 11. For example, when the electronic components are rinsed with DI water, the DI water supply 22 is operated to fill the process chamber 10 with DI water. The vaporizer 25 is then operated to introduce the heated solvent into the process chamber 10 through tubing 17. In a preferred embodiment, the heated solvent enters the process chamber 10 as a vapor and condenses on top of the fluid present in the chamber 10 to form a solvent layer. The vaporizer 25 is operated for a time sufficient to form a layer of heated solvent having a desired thickness. Although the thickness of the solvent layer can vary significantly, a solvent layer of between about 1 cm and about 2 cm is usually sufficient for most applications to provide a good balance between processing time and consumption of solvent. For example, as illustrated in FIG. 2, a solvent layer 50 having a thickness of about 1 cm can be used to process electronic components 11 such as flat, circular semiconductor wafers having a diameter of about 20 cm. Using a thin heated layer 50 of solvent (in contrast to an entire bath of solvent) also reduces solvent consumption and allows the solvent to be discarded after a single use. For example, using only a thin layer of IPA, 100 semiconductor wafers can be treated with 600 mL of IPA. Although, for the Omni system employing Full-Flow™ technology, the heated solvent layer 50 is generally produced by condensing the heated solvent vapor on a cooler liquid surface, other methods for treating electronic components with a heated solvent, including the use of nozzles to spray heated solvent onto the electronic component, can be utilized.

Figure 3A:
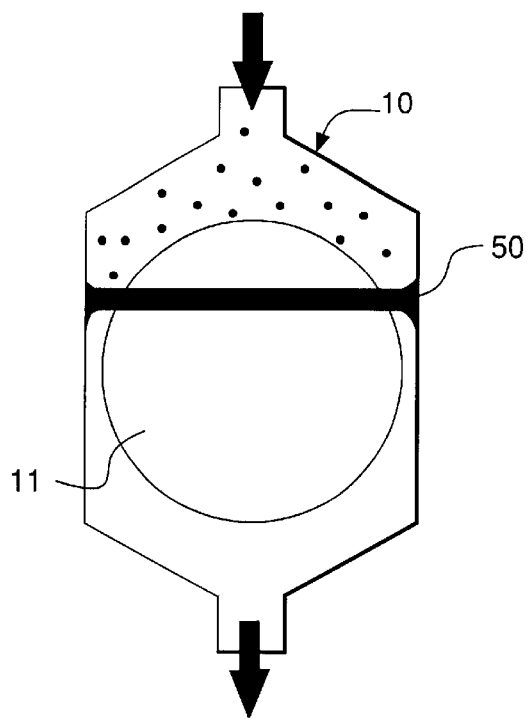
FIG. 3a shows an enlarged, front schematic view of the process chamber depicted in FIG. 1.
Figure 3B:
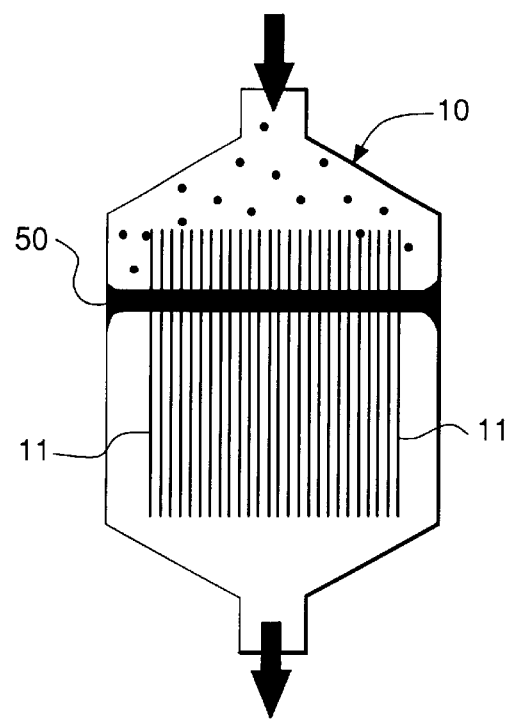
FIG. 3b shows an enlarged, side schematic view of the process chamber depicted in FIG. 1.

Once the solvent layer 50 has reached its desired thickness, the pump 45 is operated to drain the rinsing fluid from the process chamber 10 at a controlled rate. As depicted in FIGS. 3a and 3b, as the rinsing fluid is drained from the process chamber 10, the solvent layer 50 passes over the electronic components 11. Once a sufficient volume of rinsing fluid has been removed so that the solvent layer 50 has moved passed the entire surface of the electronic components 11, the pump 45 can be stopped. The rate at which the solvent layer 50 passes across the surface of the electronic component 11 is preferably controlled so that each point along the surface of the electronic component 11 is contacted by heated solvent for about one minute. For example, referring to FIG. 2, when a heated IPA layer of 1 cm thickness is used to scan wafers having a diameter of 20 cm, the total scan time is only about 16 min to remove a photoresist layer of about 12000 Å.

After exposure of the electronic components 11 to the heated solvent, a residual organic layer may remain on the electronic component 11. Accordingly, the electronic components 11 are preferably exposed to an ozonated process fluid (e.g., ozonated deionized (DI) water) to remove the residual organic layer. The electronic components 11 can be contacted with the ozonated process fluid in any manner that wets the surfaces of the electronic components 11 with the ozonated process fluid. For example, the electronic components 11 may be immersed and withdrawn from the ozonated process fluid. The electronic components 11 may also be placed in the processing chamber 10, where the processing chamber 10 is then filled and subsequently drained of the ozonated process fluid. The ozonated process fluid may also be applied to the electronic components 11 as a spray or mist. The electronic components 11 are exposed to the ozonated process fluid for a time sufficient to remove the residual organic layer. The actual contact time chosen will also depend on such variables as the temperature, pressure, and composition of the ozonated process fluid, and the composition of the surfaces of the electronic components 11. Preferably, the contact time with the ozonated process fluid will be for at least 30 seconds. X-ray photoemission spectroscopy (XPS) measurements have shown that the residual organic layer is typically about 30 to about 50 Å thick. Accordingly, the electronic components 11 are preferably contacted with the ozonated process fluid for between about 30 seconds and about 10 minutes, and more preferably for between about 4 minutes and about 8 minutes.

In addition to the heated solvent and ozonated process fluid, the electronic components 11 may be contacted with any number of other reactive chemical process fluids (e.g., gas, liquid, vapor or any combination thereof) to achieve the desired result. For example, the electronic components 11 may be contacted with reactive chemical process fluids used to etch, grow an oxide layer, to remove photoresist, to enhance cleaning, or combinations thereof. The electronic components 11 may also be rinsed with a rinsing fluid at any time during the wet processing method. Preferably, the reactive chemical process fluids and rinsing fluids are liquids. Such processing steps are optionally performed: (1) prior to exposing the component to the heated solvent; (2) after exposing the component to the heated solvent but prior to exposing the component to the ozonated process fluid; (3) after exposing the component to the ozonated process fluid but prior to exposing the component to the optional drying process fluid; and/or (4) after exposing the component to the optional drying process fluid. Preferably, the procesing steps are performed after exposing the component to the ozonated process fluid but prior to exposing the component to the optional drying process fluid. Suitable methods and systems of injecting processing fluids or other chemicals into the process chamber of the vessel module are described in, for example, U.S. Pat. Nos. 4,778,532; 4,917,123; 4,795,497; and 4,899,767, which are hereby incorporated by reference in their entireties.

The optional reactive chemical process fluids useful in the present invention contain one or more chemically reactive agents to achieve the desired surface treatment. Preferably, the concentration of such chemically reactive agents will be greater than 1000 ppm and more preferably greater than 10,000 ppm, based on the weight of the reactive chemical process fluid. However, in the case of ozone, generally the concentration is equal to or greater than about 10 ppm and more preferably from about 10 ppm to about 50 ppm. Examples of chemically reactive agents include for example hydrochloric acid or buffers containing the same, ammonium hydroxide or buffers containing the same, hydrogen peroxide, sulfuric acid or buffers containing the same, mixtures of sulfuric acid and ozone, hydrofluoric acid or buffers containing the same, chromic acid or buffers containing the same, phosphoric acid or buffers containing the same, acetic acid or buffers containing the same, nitric acid or buffers containing the same, ammonium fluoride buffered hydrofluoric acid, deionized water and ozone, or combinations thereof.

It is also possible for the reactive chemical process fluid to contain 100% of one or more chemically reactive agents. For example, it may be desired to contact the electronic components with solvents such as acetone, N-methyl pyrrolidone, or combinations thereof. Such solvents are chemically reactive agents used, for example, to remove organics or to provide other cleaning benefits.

Examples of preferred reactive chemical process fluids useful in the present invention include cleaning fluids, etching fluids, and photoresist removal fluids. Cleaning fluids typically contain one or more corrosive agent such as an acid or base. Suitable acids for cleaning include for example sulfuric acid, hydrochloric acid, nitric acid, or aqua regia. Suitable bases include for example, ammonium hydroxide. The desired concentration of the corrosive agent in the cleaning fluid will depend upon the particular corrosive agent chosen and the desired amount of cleaning. These corrosive agents may also be used with oxidizing agents such as ozone or hydrogen peroxide. Preferred cleaning solutions are "APM" solutions containing water, ammonia, and hydrogen peroxide, and "HPM" solutions containing water, hydrogen peroxide, and hydrochloric acid. Typical concentrations for HPM solutions range from about 5:1:1 to about 200:1:1 parts by volume $H_2O:H_2O_2:NH_4OH$. Typical concentrations for APM solutions range from about 5:1:1 to about 1000:0:1 parts by volume $H_2O:NH_4:HCl$. Suitable etching solutions contain agents that are capable of removing oxides. A common etching agent used is for example hydrofluoric acid, buffered hydrofluoric acid, ammonium fluoride, or other substances which generate hydrofluoric acid in solution. A hydrofluoric acid containing etching solution may contain for example from about 4:1 to about 1000:1 parts by weight $H_2O:HF$. One skilled in the art will recognize that there are various process fluids that can be used during wet processing. Other examples of process fluids that can be used during wet processing are disclosed in "Chemical Etching" by Werner Kern et al., in *Thin Film Processes*, edited by John L. Vossen et al., published by Academic Press, NY 1978, pages 401–496, which is incorporated by reference in its entirety.

The electronic components 11 may also be contacted with rinsing fluids during the methods of the present invention. Any rinsing fluid may be chosen that is capable of achieving the effects described above. In selecting a rinsing fluid, such factors as the nature of the surfaces of the electronic components to be rinsed, the nature of contaminants dissolved in the reactive chemical process fluid, and the nature of the reactive chemical process fluid to be rinsed should be considered. Also, the proposed rinsing fluid should be compatible (i.e., relatively non-reactive) with the materials of construction in contact with the fluid. Rinsing fluids which may be used include for example water, organic solvents, mixtures of organic solvents, ozonated water, or combinations thereof. Preferred organic solvents include those organic compounds useful as drying solutions disclosed hereinafter such as $C_1$ to $C_{10}$ alcohols, and preferably $C_1$ to $C_6$ alcohols. Preferably the rinsing fluid is a liquid and, more preferably, deionized water.

Rinsing fluids may also optionally contain low levels of chemically reactive agents to enhance rinsing. For example, the rinsing fluid may be a dilute aqueous solution of hydrochloric acid or acetic acid to prevent, for example, metallic deposition on the surface of the electronic component. Surfactants, anti-corrosion agents, and/or ozone are other additives used in rinsing fluids. The concentration of such additives in the rinsing fluid is minute. For example, the concentration is preferably not greater than about 1000 ppm by weight and more preferably not greater than 100 ppm by weight based on the total weight of the rinsing fluid. In the case of ozone, preferably the concentration of ozone in the rinsing fluid is 5 ppm or less.

One skilled in the art will recognize that the selection of reactive chemical process fluids, the sequence of reactive chemical process fluids and rinsing fluids, and the processing conditions (e.g., temperature, concentration, contact time and flow of the process fluid) will depend upon the desired wet processing results. For example, the electronic components 11 could be contacted with a rinsing fluid before or after one or more chemical treatment steps. Alternatively, it may be desired in some wet processing methods to have one chemical treatment step directly follow another chemical treatment step, without contacting the electronic components with a rinsing fluid between two chemical treatment steps (i.e., no intervening rinse). Such sequential wet processing, with no intervening rinse, is described in for example U.S. Pat. No. 6,132,522, which is hereby incorporated by reference in its entirety.

In a preferred embodiment of the present invention, the electronic components 11 are contacted with at least one processing fluid that is a liquid (i.e., processing solution) subsequent to contact with the ozonated process fluid to aid in removal of reaction by products or residual chemicals such as oxidized organic material. This subsequent contacting of the electronic components is especially preferred when the ozonated process fluid is used to remove organic materials from the surfaces of the electronic components. The processing solution may be a reactive chemical process liquid or rinsing liquid or combinations thereof.

For example, in one embodiment of the present invention, after contact with the ozonated process fluid, the electronic components 11 are contacted with a cleaning solution such as an APM solution, an HPM solution, and/or a hydrofluoric acid solution. The APM solution, the HPM solution, and the etching solution may be used in any sequence. In preferred embodiments, the electronic components 11 are contacted with an HPM solution having a concentration of about 80:3:1 parts by volume $H_2:H_2O_2O:NH_4OH$; an APM solution having a concentration of 80:1:1 parts by volume $H_2O:NH_4:HCl$; and/or a hydrofluoric acid solution having a concentration of about 4:1 to about 1000:1 parts by volume $H_2O:HF$. Preferably, the APM, HPM, and/or hydrofluoric acid solutions are at a temperature of from about 15° C. to about 95° C., and more preferably from about 25° C. to about 45° C. Preferably, the rinsing liquid is at a temperature of from about 15° C. to about 90° C., and more preferably from about 25° C. to about 30° C. The use of an HPM, APM, and/or hydrofluoric acid solution is particularly useful for cleaning and etching. Following contact with the APM, HPM, and/or hydrofluoric acid solution, the electronic components 11 may be optionally rinsed with a rinsing liquid such as deionized water.

In another embodiment of the present invention, the electronic components 11 may be contacted with an etching solution subsequent to contact with the ozonated process fluid. Where the etching solution contains hydrofluoric acid, preferably the temperature of the hydrofluoric acid is from about 15° C. to about 95° C., and more preferably from about 24° C. to about 40° C. Following etching, the electronic components may be contacted with a rinsing liquid such as deionized water. Preferably the temperature of the rinsing liquid is from about 15° C. to about 90° C., and more preferably from about 25° C. to about 30° C.

Following wet processing with the ozonated process fluid, reactive chemical process fluids or rinsing fluids, the electronic components 11 are preferably dried. By "dry" or "drying" it is meant that the electronic components 11 are preferably made substantially free of liquid droplets. By removing liquid droplets during drying, impurities present in the liquid droplets do not remain on the surfaces of the semiconductor substrates when the liquid droplets evaporate. Such impurities undesirably leave marks (e.g., watermarks) or other residues on the surfaces of the semiconductor substrates. However, it is also contemplated that drying may simply involve removing a treating, or rinsing fluid, for example with the aid of a drying fluid stream, or by other means known to those skilled in the art. Any method or system of drying may be used. Suitable methods of drying include for example evaporation, centrifugal force in a spin-rinser-dryer, steam or chemical drying, or combinations thereof. In a preferred embodiment, the wet processing and drying is performed in a single processing chamber without removing the electronic components from the processing chamber. Suitable drying methods also include methods that leave a thin film, or portion thereof, on the surfaces of the electronic components 11.

A preferred method of drying uses a drying fluid stream to directly displace the last processing solution that the electronic components 11 are contacted with prior to drying (hereinafter referred to as "direct displace drying"). Suitable methods and systems for direct displace drying are disclosed in for example U.S. Pat. Nos. 4,778,532, 4,795,497, 4,911, 761, 4,984,597, 5,571,337, and 5,569,330. Other direct displace dryers that can be used include Marangoni type dryers supplied by manufacturers such as Mattson Technology, Inc. Preferably, the drying fluid stream is formed from a partially or completely vaporized drying solution. The drying fluid stream may be for example superheated, a mixture of vapor and liquid, saturated vapor or a mixture of vapor and a noncondensible gas.

The drying solution chosen to form the drying fluid stream is preferably miscible with the last process fluid in the process chamber 10 and non-reactive with the surfaces of the electronic components 11. The drying solution also preferably has a relatively low boiling point to facilitate drying. Since water is the most convenient and commonly used solvent for chemical treatment or rinsing fluids, a drying solution which forms a minimum-boiling azeotrope with water is especially preferred. For example, the drying solution is preferably selected from organic compounds having a boiling point of less than about 140° C. at atmospheric pressure. Examples of drying solutions which may be employed are steam, alcohols such as methanol, ethanol, 1-propanol, isopropanol, n-butanol, secbutanol, tertbutanol, or tert-amyl alcohol, acetone, acetonitrile, hexafluoroacetone, nitromethane, acetic acid, propionic acid, ethylene glycol mono-methyl ether, difluoroethane, ethyl acetate, isopropyl acetate, 1,1,2-trichloro-1,2,2-trifluoroethane, 1,2-dichloroethane, trichloroethane, perfluoro-2-butyltetrahydrofuran, perfluoro-1,4-dimethylcyclohexane or combinations thereof. Preferably, the drying solution is a $C_1$ to $C_6$ alcohol, such as for example methanol, ethanol, 1-propanol, isopropanol, n-butanol, secbutanol, tertbutanol, tert-amyl alcohol, pentanol, hexanol or combinations thereof.

Following drying, the electronic components may be removed from the drying processing chamber and further processed in any desired manner.

These and other aspects and advantages of the invention may be further understood by reference to the following examples, which are provided for illustrative purposes only and are not intended in any way to be limiting.

EXAMPLES

The etch rates for photoresists (obtained from JSR and TOK) on semiconductor wafer substrates was evaluated.

The wafers were treated with a heated (boiling) layer of IPA and/or ozonated DI water in an apparatus similar to the one described above in connection with FIG. 1. The treatment with ozonated DI water was optionally accompanied by megasonic cleaning. The wafers were contacted with these solvents in a Mattson Technology, Inc.'s OMNI system employing Full-Flow™ technology. The ozonated DI water was mainatined at a temperature of 28° C. The maximum concentration of dissolved ozone used was about 60 ppm.

Figure 4:
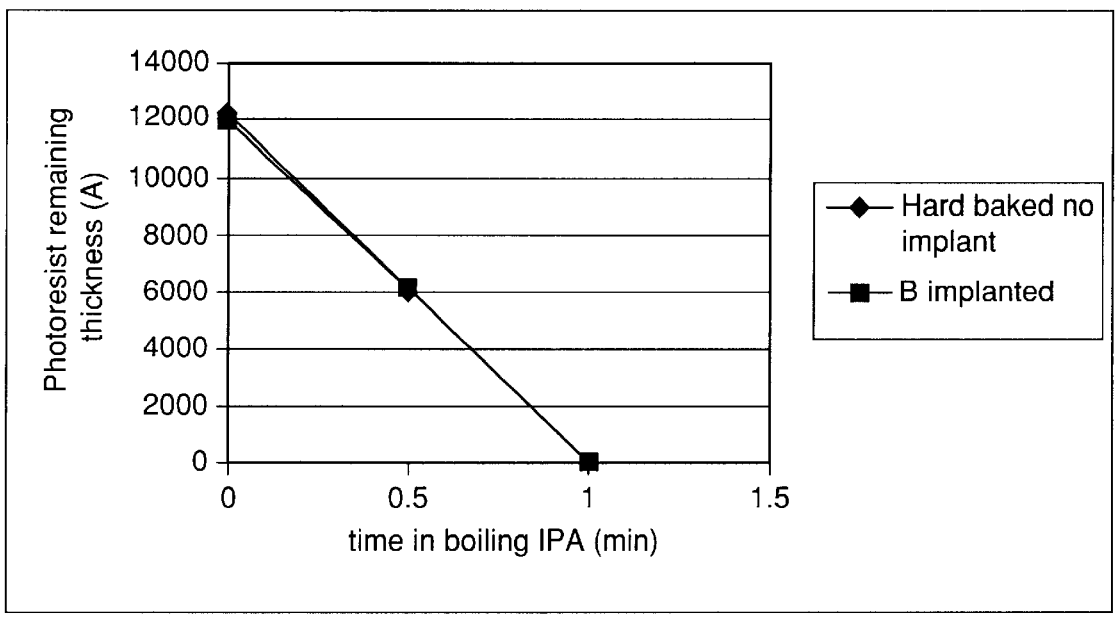
FIG. 4 is a graph showing the thickness of photoresist remaining on semiconductor wafer substrates upon treatment with a heated isopropyl alcohol solvent as a function of time.

The etch rate of bulk photoresist (hard baked with no implanted material, or implanted with boron) in heated IPA was determined as a function of time. The photoresist remaining on the wafers was measured with a Rudolph ellipsometer Caliber 300. The results are depicted in FIG. 4. The data of FIG. 4 show that etch rates of photoresist in heated IPA are uniform and on the order of about 12000 Å/min. However, X-ray photoemission spectroscopy (XPS) measurements indicate that after exposure to heated IPA, a thin residue of organic material remained on the wafers. This layer was on the order of 30 to 50 Å thick. When the wafers, that were treated with heated IPA, were subsequently contacted with ozonated DI water, there was no evidence of any residue on the surfaces of the wafers when the surfaces were examined with ellipsometer measurements using particle scanning or XPS.

Figure 5:
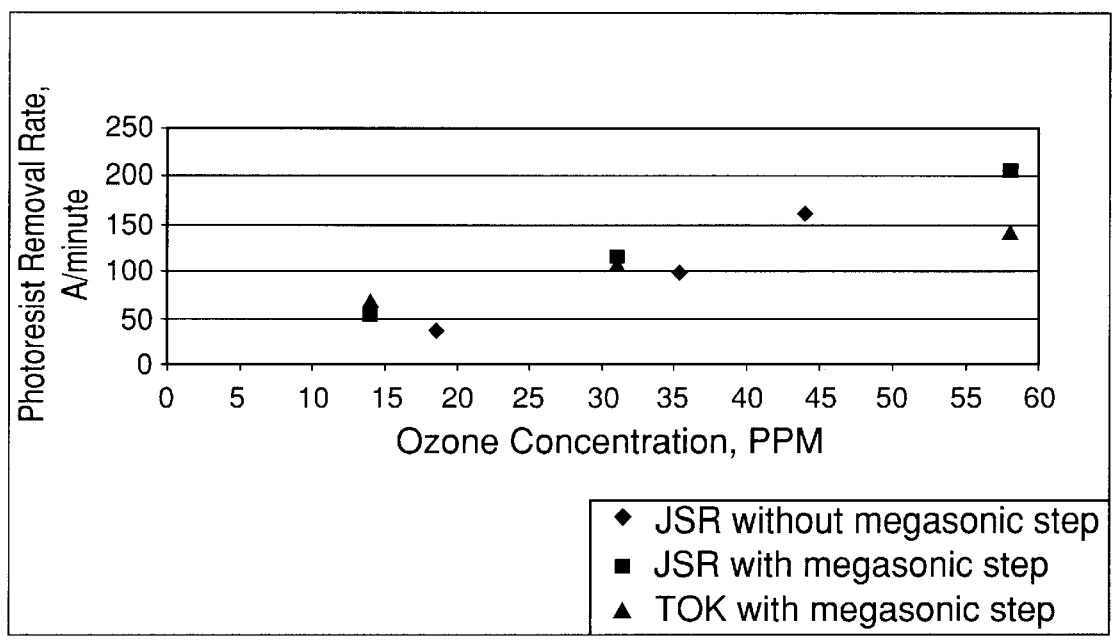
FIG. 5 is a graph showing photoresist removal rates from semiconductor wafer substrates upon treatment with an ozonated deionized water as a function of dissolved ozone concentration.

For comparison purposes, the etch rates of ozonated deionized water alone were also measured. Referring to FIG. 5, etch rates of between about 100 Å/min and about 200 Å/min were readily obtained when the ozone concentration was sufficiently high. These etch rates are too slow to remove bulk photoresist (which is typically about 12000 Å thick) in a commercially viable process. However, the etch rates of ozonated deionized water are suitable for removing the residual organic layer left on electronic components when those components are pre-treated with heated solvents such as isopropyl alcohol.

Those skilled in the art will appreciate that numerous changes and modifications may be made to the preferred embodiments of the invention and that such changes and modifications may be made without departing from the spirit of the invention. It is therefore intended that the appended claims cover all equivalent variations as fall within the true scope and spirit of the invention.

What is claimed is:

1. A process for treating an electronic component in a process chamber comprising:
   a. introducing into the process chamber a solvent in its vapor state;
   b. forming a heated liquid solvent layer adjacent to a first liquid in which the electronic component is positioned;
   c. exposing the electronic component to the heated liquid solvent layer; and
   d. subsequently exposing the electronic component to an ozonated process fluid.

2. The process of claim 1 wherein the solvent comprises isopropyl alcohol.

3. The process of claim 1 wherein the electronic component comprises a semiconductor wafer.

4. The process of claim 1 wherein the electronic component is exposed to the heated liquid solvent layer at a rate effective to substantially remove bulk organic material.

5. The process of claim 4 wherein the rate at which the heated liquid solvent layer passes across the surface of the electronic component is controlled so that each point along the surface of the electronic component is contacted by the heated liquid solvent layer for about one minute.

6. The process of claim 4 wherein the organic material comprises boron implanted photoresist.

7. The process of claim 1 wherein the electronic component is exposed to the ozonated process fluid for a time effective to substantially remove remaining organic material.

8. The process of claim 1 wherein the heated liquid solvent layer is at least about 1 cm in depth.

9. The process of claim 1 wherein the heated liquid solvent layer is between about 1 cm and 2 cm in depth.

10. The process of claim 1 wherein the first liquid is an aqueous solution.

11. The process of claim 1 wherein the ozonated process fluid comprises ozone, and a process fluid selected from the group consisting of: water, deionized water, sulfuric acid, hydrochloric acid, hydrogen peroxide, ammonia hydroxide, hydrofluoric acid, ammonia fluoride, phosphoric acid, nitric acid, aqua regia, and combinations thereof.

12. The process of claim 11 wherein the ozonated process fluid comprises ozone and deionized water.

13. The process of claim 1 wherein the electronic component is exposed to the liquid solvent layer by removing the first liquid from the process chamber.

14. The process of claim 1 wherein the electronic component is exposed to the heated liquid solvent layer by lifting the electronic component out of the first liquid.

15. The process of claim 1 wherein the ozonated process fluid directly displaces the heated liquid solvent layer.

16. The process of claim 1 wherein the ozonated process fluid comprises at least 60 ppm ozone.

17. The process of claim 1 wherein the ozonated process fluid is at a temperature of at least 30° C.

18. A process for treating surfaces of electronic components, comprising:
   a. placing an electronic component in a single vessel wet processing system;
   b. contacting the electronic component with a first liquid whereby the electronic component is submerged in the first liquid;
   c. introducing a solvent vapor into the single vessel wet processing system and condensing at least a portion of the solvent vapor to form a liquid solvent layer on top of the first liquid and thereby forming a liquid solvent and first liquid interface at a position above the electronic component;
   d. adjusting the position of the electronic component with respect to the liquid solvent and first liquid interface so that the electronic component is exposed to the liquid solvent; and
   e. subsequently exposing the electronic component to an ozonated process fluid.

19. The process of claim 18 wherein the solvent vapor is introduced under conditions such that within the single vessel wet processing system a vapor phase of the solvent vapor exists above the liquid solvent and first liquid interface.

20. The process of claim 19 wherein the solvent vapor comprises isopropyl alcohol.

21. The process of claim 19 wherein the first liquid is an aqueous solution.

22. The process of claim 19 wherein the liquid solvent layer is at least about 1 cm in depth.

23. The process of claim 19 wherein the liquid solvent layer is between about 1 cm and 2 cm in depth.

24. The process of claim 19 wherein the adjusting step comprises holding the electronic component in a fixed position and removing the first liquid from the single vessel system.

25. The process of claim 19 wherein the adjusting step comprises lifting the electronic component out of the first liquid.

26. The process of claim 19 further comprising, subsequent to exposing the electronic component to the liquid solvent and prior to exposing the electronic component to the ozonated process fluid, exposing the electronic component to the solvent vapor.

27. A process for treating semiconductor wafers, comprising:
   a. placing a semiconductor wafer in a single vessel wet processing system;
   b. contacting the semiconductor wafer with an aqueous liquid whereby the electronic component is submerged in the aqueous liquid;
   c. introducing an isopropyl alcohol vapor into the single vessel wet processing system and condensing at least a portion of the isopropyl alcohol vapor to form a liquid isopropyl alcohol layer on top of the aqueous liquid and thereby forming a liquid isopropyl alcohol and aqueous liquid interface at a position above the semiconductor wafer;
   d. adjusting the position of the semiconductor wafer with respect to the liquid isopropyl alcohol and aqueous liquid interface so that the semiconductor wafer is exposed to the liquid isopropyl alcohol; and
   e. subsequently exposing the electronic component to a process fluid comprising ozonated deionized water.

28. The process of claim 27 wherein the isopropyl alcohol vapor is introduced under conditions such that within the single vessel a vapor phase comprising isopropyl alcohol exists above the liquid isopropyl alcohol and aqueous liquid interface.

29. The process of claim 28 wherein the isopropyl alcohol layer is at least about 1 cm in depth.

30. The process of claim 28 wherein the isopropyl alcohol layer is between about 1 cm and 2 cm in depth.

31. The process of claim 28 wherein the adjusting step comprises holding the semiconductor wafer in a fixed position and removing the aqueous liquid from the single vessel wet processing system.

32. The process of claim 28 wherein the adjusting step comprises lifting the semiconductor wafer out of the aqueous liquid.

33. The process of claim 28 further comprising, subsequent to exposing the semiconductor wafer to the liquid isopropyl alcohol and prior to exposing the electronic component to the ozonated process fluid, exposing the semiconductor wafer to the isopropyl alcohol vapor.

34. A process for treating an electronic component in a process chamber comprising:
   a. exposing the electronic component to a heated liquid solvent layer;
   b. subsequently exposing the electronic component to a heated solvent vapor; and
   c. subsequently exposing the electronic component to an ozonated process fluid.

35. The process of claim 34 wherein the heated liquid solvent layer is formed adjacent to a first liquid in which the electronic component is positioned.

36. The process of claim 35 wherein the first liquid is an aqueous solution.

37. The process of claim 34 wherein the heated liquid solvent comprises isopropyl alcohol and the heated solvent vapor comprises isopropyl alcohol.

38. The process of claim 34 wherein the electronic component is exposed to the heated liquid solvent layer for a rate effective to substantially remove bulk organic material.

39. The process of claim 38 wherein the rate at which the heated liquid solvent layer passes across the surface of the electronic component is controlled so that each point along the surface of the electronic component is contacted by the heated liquid solvent layer for about one minute.

40. The process of claim 38 wherein the organic material comprises boron implanted photoresist.

41. The process of claim 38 wherein the electronic component is exposed to the ozonated process fluid for a time effective to substantially remove remaining organic material.

42. The process of claim 34 wherein the heated liquid solvent layer is at least about 1 cm in depth.

43. The process of claim 34 wherein the heated liquid solvent layer is between about 1 cm and 2 cm in depth.

44. The process of claim 34 wherein the ozonated process fluid comprises ozone, and a process fluid selected from the group consisting of: water, deionized water, sulfuric acid, hydrochloric acid, hydrogen peroxide, ammonia hydroxide, hydrofluoric acid, ammonia fluoride, phosphoric acid, nitric acid, aqua regia, and combinations thereof.

45. The process of claim 44 wherein the ozonated process fluid comprises ozone and deionized water.

46. The process of claim 34 wherein the electronic component is exposed to the liquid solvent layer by removing the first liquid from the process chamber.

47. The process of claim 34 wherein the electronic component is exposed to the heated liquid solvent layer by lifting the electronic component out of the first liquid.

48. The process of claim 34 wherein the heated solvent vapor directly displaces the heated liquid solvent layer.

49. The process of claim 34 wherein the ozonated process fluid directly displaces the heated solvent vapor.

50. The process of claim 34 wherein the ozonated process fluid comprises at least 60 ppm ozone.

51. The process of claim 34 wherein the ozonated process fluid is at a temperature of at least 30° C.

* * * * *